US012646685B2

(12) United States Patent
Carroll et al.

(10) Patent No.: US 12,646,685 B2
(45) Date of Patent: Jun. 2, 2026

(54) VHF BROADBAND COAXIAL ADAPTER

(71) Applicant: Tokyo Electron Limited, Tokyo (JP)

(72) Inventors: John Carroll, Austin, TX (US);
Jianping Zhao, Austin, TX (US)

(73) Assignee: Tokyo Electron Limited, Tokyo (JP)

( * ) Notice: Subject to any disclaimer, the term of this
patent is extended or adjusted under 35
U.S.C. 154(b) by 650 days.

(21) Appl. No.: 17/992,432

(22) Filed: Nov. 22, 2022

(65) Prior Publication Data

US 2024/0170256 A1      May 23, 2024

(51) Int. Cl.
*H01J 37/32* (2006.01)
*C23C 16/511* (2006.01)

(52) U.S. Cl.
CPC ... *H01J 37/32183* (2013.01); *H01J 37/32211*
(2013.01); *C23C 16/511* (2013.01); *H01J
2237/336* (2013.01)

(58) Field of Classification Search
CPC ......... H01J 37/32183; H01J 37/32192–32311;
H01J 37/32917–3299; H01J 2237/336;
C23C 16/511; H01L 21/67248
See application file for complete search history.

(56) References Cited

U.S. PATENT DOCUMENTS 4,782,314 A * 11/1988 Muller ..................... H01P 1/08
333/252
5,718,795 A * 2/1998 Plavidal .............. H01J 37/3266
156/345.46

6,033,481 A * 3/2000 Yokogawa ........ H01J 37/32678
156/345.48
6,954,077 B2 * 10/2005 Strang ............... H01J 37/32275
324/636
7,220,937 B2 * 5/2007 Hofman ............ H01J 37/32183
219/121.52
2002/0104751 A1 8/2002 Drewery
2003/0038688 A1 * 2/2003 Mitrovic ................. H01P 5/024
315/111.21
2004/0211759 A1 10/2004 Hoffman
(Continued)

FOREIGN PATENT DOCUMENTS

CN        113045065 A      6/2021

OTHER PUBLICATIONS

International Search Report and Written Opinion, PCT Application
No. PCT/US2023/030524, mailed Dec. 5, 2023, 10 pages.

*Primary Examiner* — Gordon Baldwin
*Assistant Examiner* — Todd M Seoane
(74) *Attorney, Agent, or Firm* — Slater Matsil, LLP

(57) ABSTRACT

According to an embodiment, an apparatus for a plasma
processing system is provided. The apparatus includes a
conductive conical frustum having an open top base, an open
bottom base, and a surface area coupling the open top base
to the open bottom base. A conductive cylinder is positioned
within the conductive conical frustum with a closed bottom
base and an open top base. The open top base of the
conductive cylinder is connected to sidewalls of the open top
base of the conductive conical frustum. The conductive
cylinder has a height shorter than the height of the conduc-
tive conical frustum. The apparatus is configured to provide
a broadband RF transition from a matching network to a
resonating structure of the plasma processing system for
frequencies ranging between 13 megahertz (MHz) and 220
MHz.

20 Claims, 4 Drawing Sheets

(56)                    References Cited

U.S. PATENT DOCUMENTS

| 2006/0137613 | A1* | 6/2006 | Kasai | H01J 37/32192 |
| | | | | 118/723 ME |
| 2007/0189918 | A1* | 8/2007 | Gschwandtner | H05H 1/46 |
| | | | | 422/186 |
| 2008/0283507 | A1 | 11/2008 | Kitagawa | |
| 2022/0208515 | A1 | 6/2022 | Choi | |

* cited by examiner

200

202

200

208

206

204

α

202

210

VHF BROADBAND COAXIAL ADAPTER

TECHNICAL FIELD

The present disclosure generally relates to transmission lines and, in particular embodiments, to a very high frequency (VHF) broadband coaxial adapter.

BACKGROUND

Plasma processing is extensively used in the manufacturing and fabrication of high-density microscopic circuits within the semiconductor industry. In a plasma processing system, an electromagnetic wave is radiated by a resonating antenna into a plasma chamber, which generates an electromagnetic field. The generated electromagnetic field heats electrons in the chamber. The heated electrons ignite plasma that treats the substrate through etching, deposit, oxidation, sputtering, or the like.

The electromagnetic wave is generated in response to a radio frequency (RF) wave propagating from an RF source. Generally, the RF signal is fed to the resonating antenna via a coaxial transmission line. An adapter is used to minimize RF mismatches between the impedance of the connecting terminal of the coaxial transmission line and the impedance of the resonating structure and the changing plasma impedance. Existing adapters operate at a narrow frequency range centered at the operation frequency of the corresponding plasma processing application. Thus, adapters are frequently interchanged across various processing applications, which operate under a range of frequencies and multiple load conditions. A single adapter and system that operates across a broad frequency range and load conditions in, for example, a plasma processing system are, thus, desirable.

SUMMARY

Technical advantages are generally achieved by embodiments of this disclosure which describe an apparatus and device used in plasma processing.

A first aspect relates to an apparatus for a plasma processing system. The apparatus includes a conductive conical frustum having an open top base, an open bottom base, and a surface area coupling the open top base to the open bottom base; and a conductive cylinder positioned within the conductive conical frustum and having a closed bottom base and an open top base. The open top base of the conductive cylinder is connected to sidewalls of the open top base of the conductive conical frustum. The conductive cylinder has a height shorter than the height of the conductive conical frustum. The apparatus is configured to provide a broadband RF transition from a matching network to a resonating structure of the plasma processing system for frequencies ranging between 13 megahertz (MHz) and 220 MHz.

In a first implementation form of the apparatus according to the first aspect as such, the resonating structure of the plasma processing system is connected to sidewalls of the open bottom base of the conductive conical frustum.

In a second implementation form of the apparatus according to the first aspect as such or any preceding implementation form of the first aspect, the apparatus and the resonating structure form a volume that is vacuum sealed.

In third implementation form of the apparatus according to the first aspect as such or any preceding implementation form of the first aspect, a sensor, a cooling element, or a combination thereof is attached to an interior portion of the surface area of the conductive conical frustum.

In a fourth implementation form of the apparatus according to the first aspect as such or any preceding implementation form of the first aspect, the surface area of the conductive conical frustum is one of a wavy, a step layer, or a flat type of surface.

In a fifth implementation form of the apparatus according to the first aspect as such or any preceding implementation form of the first aspect, the apparatus is coated with a dielectric material.

In a sixth implementation form of the apparatus according to the first aspect as such or any preceding implementation form of the first aspect, the apparatus is arranged between the matching network and the resonating structure, an RF wave propagates from an RF source coupled to the matching network and is resonated by the resonating structure during a plasma processing of a semiconductor wafer in the plasma processing system.

A second aspect relates to a plasma processing system, which includes a matching network; a resonating structure; and an apparatus coupling the matching network to the resonating structure. The apparatus is configured to provide a broadband RF transition from the matching network to the resonating structure of the plasma processing system for frequencies ranging between 13 megahertz (MHz) and 220 MHz. The apparatus includes a conductive conical frustum having an open top base, an open bottom base, and a surface area coupling the open top base to the open bottom base, and a conductive cylinder positioned within the conductive conical frustum and having a closed bottom base and an open top base, the open top base of the conductive cylinder being connected to sidewalls of the open top base of the conductive conical frustum, the conductive cylinder having a height shorter than a height of the conductive conical frustum.

In a first implementation form of the system according to the second aspect as such, the apparatus and the resonating structure form a volume that is vacuum sealed.

In a second implementation form of the system according to the second aspect as such or any preceding implementation form of the second aspect, a sensor, a cooling element, or a combination thereof is attached to an interior portion of the surface area of the conductive conical frustum.

In a third implementation form of the system according to the second aspect as such or any preceding implementation form of the second aspect, the surface area of the conductive conical frustum is one of a wavy, a step layer, or a flat type of surface.

In a fourth implementation form of the system according to the second aspect as such or any preceding implementation form of the second aspect, the apparatus is coated with a dielectric material.

In a fifth implementation form of the system according to the second aspect as such or any preceding implementation form of the second aspect, the apparatus is arranged between the matching network and the resonating structure. An RF wave propagates from an RF source coupled to the matching network and resonates by the resonating structure during a plasma processing of a semiconductor wafer in the plasma processing system.

A third aspect relates to an RF connection point for a plasma processing system. The RF connection point provides a broadband RF transition from a matching network to a resonating structure of the plasma processing system for frequencies ranging between 13 megahertz (MHz) and 220 MHz. The RF connection point includes a first and a second coaxial interface. The first coaxial interface includes an adapter, a first coaxial shield, and a first insulator. The adapter includes a conductive conical frustum having an open top base, an open bottom base, and a surface area coupling the open top base to the open bottom base, and a conductive cylinder positioned within the conductive conical frustum and having a closed bottom base and an open top base. The open top base of the conductive cylinder is connected to sidewalls of the open top base of the conductive conical frustum. The conductive cylinder has a height shorter than the height of the conductive conical frustum. The first coaxial shield surrounds the adapter. The first insulator includes a first dielectric material. The first insulator is arranged between the adapter and the first coaxial shield. The second coaxial interface comprising includes a conductive core conductively connected to the adapter, a second coaxial shield surrounding the conductive core, the second coaxial shield conductively coupled to the first coaxial shield, and a second insulator comprising a second dielectric material, the second insulator arranged between the conductive core and the second coaxial shield.

In a first implementation form of the RF connection point according to the third aspect as such, the conductive core and the adapter form a vacuum sealed volume within the adapter.

In a second implementation form of the apparatus according to the third aspect as such or any preceding implementation form of the third aspect, a sensor, a cooling element, or a combination thereof is attached to an interior portion of the surface area of the conductive conical frustum.

In a third implementation form of the apparatus according to the third aspect as such or any preceding implementation form of the third aspect, the conductive core is a resonating element of the resonating structure.

In a fourth implementation form of the apparatus according to the third aspect as such or any preceding implementation form of the third aspect, the surface area of the conductive conical frustum is one of a wavy, a step layer, or a flat type of surface.

In a fifth implementation form of the apparatus according to the third aspect as such or any preceding implementation form of the third aspect, the adapter is arranged between the matching network and the resonating structure. An RF wave propagates from an RF source coupled to the matching network and resonates by the resonating structure during a plasma processing of a semiconductor wafer in the plasma processing system.

In a sixth implementation form of the apparatus according to the third aspect as such or any preceding implementation form of the third aspect, the first coaxial shield and the second coaxial shield are coupled to an RF ground of the plasma processing system.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
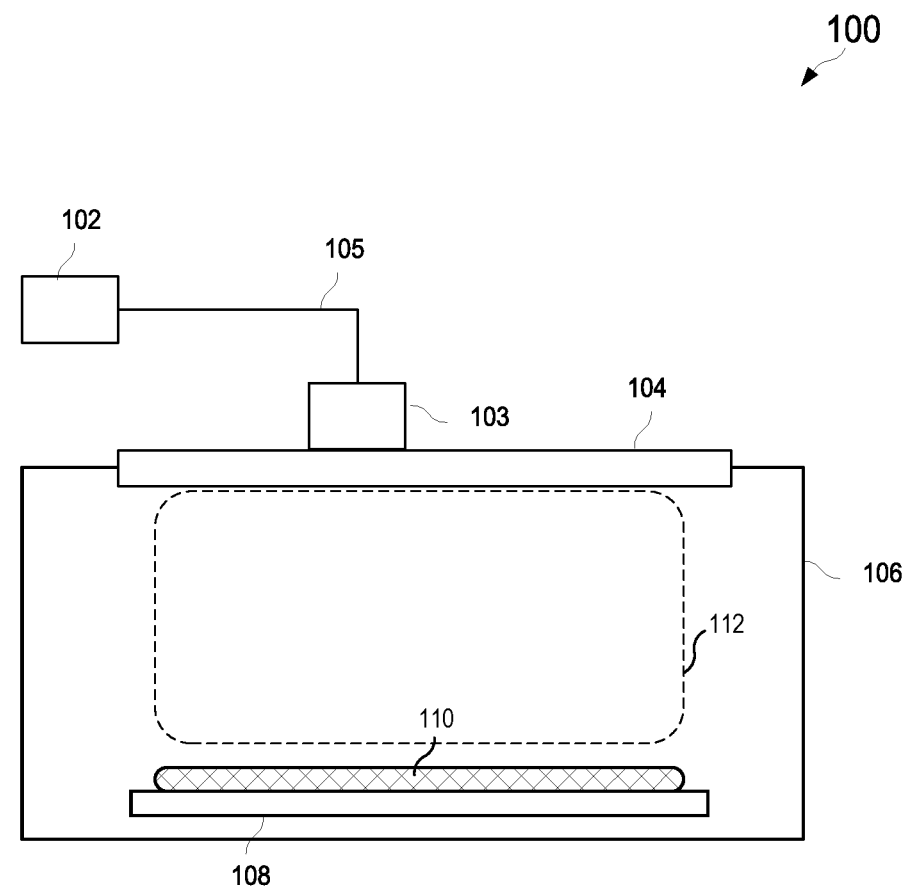
FIG. 1 is a diagram of an embodiment plasma processing system.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

While inventive aspects are described primarily in the context of treating substrates in a plasma processing system, the inventive aspects may be similarly applicable to fields outside the semiconductor industry. Plasma can be used to treat and modify surface properties through functional group addition. For example, to treat surfaces for paint deposits, plasma can convert hydrophobic surfaces to hydrophilic surfaces. Further, inventive aspects are not limited to plasma. For example, RF can be used to thaw frozen food or dry out textiles, food, wood, or the like. As another example, RF can be used in wired or wireless communication networks. In these various examples and across industries, an adapter capable of operating across a wide range of frequencies and load conditions with minimal RF reflections, as disclosed herein, is advantageous.

When a wave travels through a medium, an impedance discontinuity caused, for example, by a transition from one medium to another, results in a portion of the wave being reflected into the original medium from which the wave is traveling. The parameter used to define this ratio is the reflection coefficient. It is advantageous for RF power to be fed to the plasma chamber 106 with minimal reflection and for the reflection coefficient at the impedance discontinuity to be as low as possible.

In plasma processing systems, various processing steps require a range of operating conditions with different frequencies and load conditions. Conventionally, an adapter has been used at the transition between a matching network and a resonating structure in a plasma chamber. Existing adapters operate at a single frequency and load condition—typically tuned to the center frequency and a specific load condition. As a result, the conventional adapter in the plasma processing system is replaced based on the operating conditions, or multiple chambers must be configured to accommodate the particular processing operation.

Generally, RF power is fed to a matching network, which results in electric fields to travel into a plasma chamber. Embodiments of this disclosure provide an adapter that minimizes the reflection coefficient at the transition to the plasma chamber. Such an adapter can advantageously operate across the entire frequency and load condition of the plasma processing system across its various processing steps.

Thus, as disclosed herein, the plasma processing system incorporating the adapter becomes a broadband plasma processing system where a single chamber can operate under multiple process steps, significantly reducing the footprint in a semiconductor processing factory.

In embodiments, a cone-shaped modular coaxial transmission line adapter for delivery of very high frequency (VHF) RF power is proposed. Advantageously, the cone shape of the adapter provides a low reflection coefficient. The single adapter delivers excellent RF transition efficiency for a wide range of frequencies across different load conditions. The dimensions and material of the adapter can be adjusted to various RF load applications and across different frequency ranges. These and further details are discussed in greater detail below.

FIG. 1 illustrates a diagram of an embodiment plasma processing system 100. Plasma processing system 100 includes an RF source 102, a matching network 103, a resonating structure 104, a plasma chamber 106, which may (or may not) be arranged as shown. Plasma processing system 100 may include additional components not depicted in FIG. 1.

In embodiments, RF source 102 includes an RF power supply, which may include a generator circuit. RF source 102 is coupled to the resonating structure 104 via a power transmission line 105, such as a coaxial cable or the like, and a matching network 103.

The matching network 103 typically includes one or more capacitors and inductors. In embodiments, the capacitors and inductors may be variable. The forward and reflected power at the matching network 103 can be measured, and the matching network 103 may be adjusted to improve impedance matching. For example, a feedback loop circuit may be used to adjust the variable capacitors and inductors.

The plasma chamber 106 includes a substrate holder 108. As shown, substrate no is placed on substrate holder 108 to be processed. In embodiments, plasma chamber 106 may include additional substrate holders (not shown). In embodiments, the placement of the substrate holder 108 may differ from that shown in FIG. 1.

Once the RF power is received at the resonating structure 104, the forward RF wave travels through the resonating structure 104 and an electromagnetic field is transmitted (i.e., radiated) towards the plasma chamber 106. The radiated electromagnetic field causes the gas (e.g., oxygen, argon, etc.) within the plasma chamber 106 to become ionized to form an azimuthally symmetric, high-density plasma 112 with low capacitively coupled electric fields. In embodiments, oxygen and argon plasmas are used to etch, activate, or clean the surface of a substrate no.

In embodiments, the excitation frequency of the resonating structure 104 is in the radio frequency range (10-400 MHz), which is not limiting, and other frequency ranges can similarly be contemplated. For example, inventive aspects disclosed herein equally apply to applications in the microwave frequency range.

In embodiments, resonant elements of the resonating structure 104 sustain standing electromagnetic waves. The standing electromagnetic waves have regions where the electric field is high and other regions where the magnetic field is high. The regions where the magnetic fields are high consist of conductive paths. The oscillating magnetic field from the resonant elements of the resonating structure 104 penetrates within the plasma chamber 106. The time-varying magnetic field induces a time-varying electric field, which transfers energy to plasma electrons.

In embodiments, the resonating structure 104 includes regions where the electric field is high. In embodiments, such regions consist of metal structures with a flat surface. In embodiments, the flat surfaces of two of the metal pieces are opposed and separated by a dielectric. The volume between the two metal pieces occupied by the dielectric is the location of the high electric fields in the respective resonant circuit of the resonating structure 104.

In other embodiments, the metal pieces may have cylindrical or other geometries. In all cases, two metal surfaces are separated by a region filled with a dielectric material, which may also be air or vacuum.

The magnetic fields in the high magnetic field elements are due to currents that flow along these elements. The electric fields in the high electric field elements are due to the presence of charge. The elements with high electric fields are connected with other such elements through the elements with high magnetic fields such that charge flows from one region of a high electric field to another region of high electric fields by a current, which produces the magnetic field in the high magnetic field elements.

In embodiments, the elements of the resonating structure 104 are arranged about a central axis of symmetry where the magnetic field is high and the elements of the resonating structure 104 where the electric field is high.

In embodiments, the RF source 102 couples energy to an interface of the resonating structure 104 to generate the standing electromagnetic waves from the resonating structure 104. The RF source 102 is coupled to the interface via a transmission line 105 in embodiments.

Figure 2A:
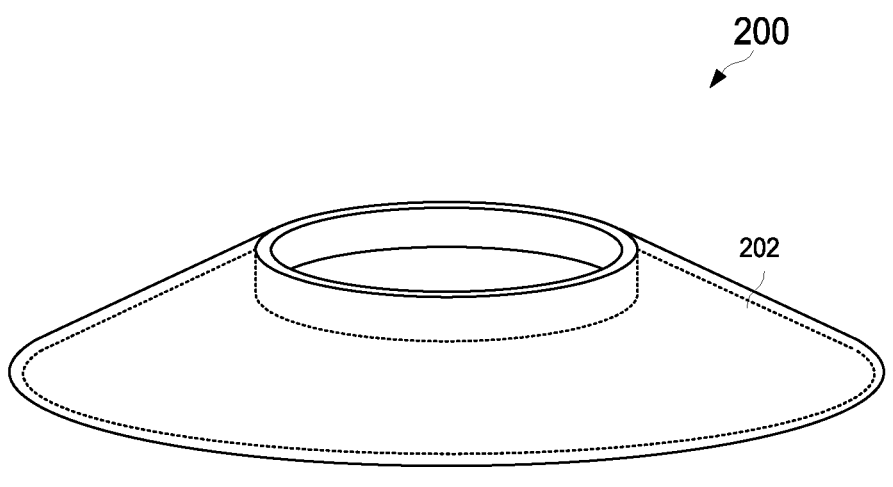
FIG. 2A is a perspective view of an embodiment adapter.
Figure 2B:
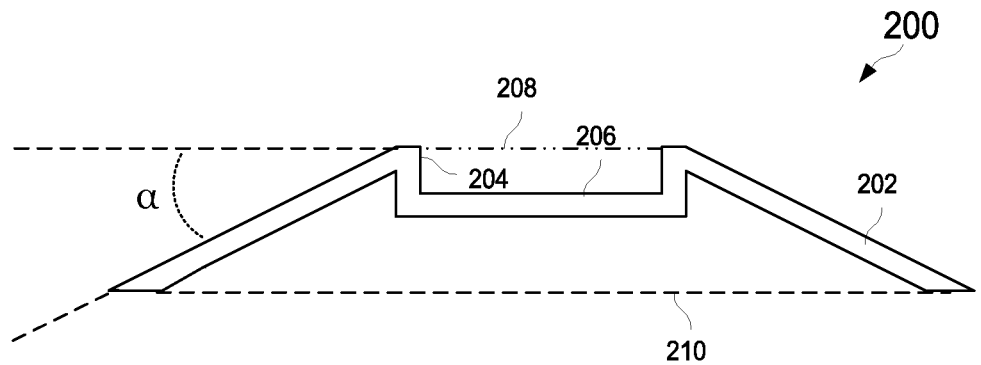
FIG. 2B is a cross-sectional view of an embodiment adapter.

FIGS. 2A-B illustrate an embodiment adapter 200. FIG. 2A illustrates a perspective view of adapter 200, and FIG. 2B illustrates a cross-sectional view of adapter 200.

Adapter 200 is primarily comprised of a conical frustum 202 mechanically attached to a cylinder 204 with a one-sided closed base 206; each being a conductive structure.

The conical frustum 202 has a top base 208 and a bottom base 210. The diameter of the top base 208 is smaller than the diameter of the bottom base 210. In embodiments, the top base 208 and the bottom base 210 of the conical frustum are open at each side.

The conical frustum 202 has a surface area that is shown as flat. However, other surface types, such as a multiple-faced surface (e.g., step layer or wavy), are also contemplated.

In embodiments, the internal portion of the surface area (i.e., facing the bottom base 210) of the conical frustum 202 may include mounting options. For example, in embodiments, a cooling element or showerhead can be attached to the internal portion of the surface area of the conical frustum 202. The cooling or showerhead can be used to regulate the temperature in the vicinity of the adapter 200 during processing, for example, a semiconductor wafer. As another example, in embodiments, a diagnostic sensor such as an optical emission spectrometer (OES) type sensor may be mounted to the internal portion of the surface area of the conical frustum 202 to, for example, monitor process uniformity or performance factors during semiconductor processing.

The angle between the top base 208 of the conical frustum 202 and the surface area of the conical frustum 202 is represented by the cone angle (a). In embodiments, the cone angle is between 1° and 89°.

The top base 208 of the conical frustum 202 is conductively coupled to cylinder 204. The height of cylinder 204 is less than the height of the conical frustum 202. Cylinder 204 is the original point from which RF waves travel to adapter 200. In embodiments, the center conductor of a coaxial cable or coaxial RF connector makes RF contact with cylinder 204. In embodiments, RF waves from the coaxial cable or the coaxial RF connector travel near the surface (i.e., skin effect) of the conductive, adapter 200.

Figure 3:
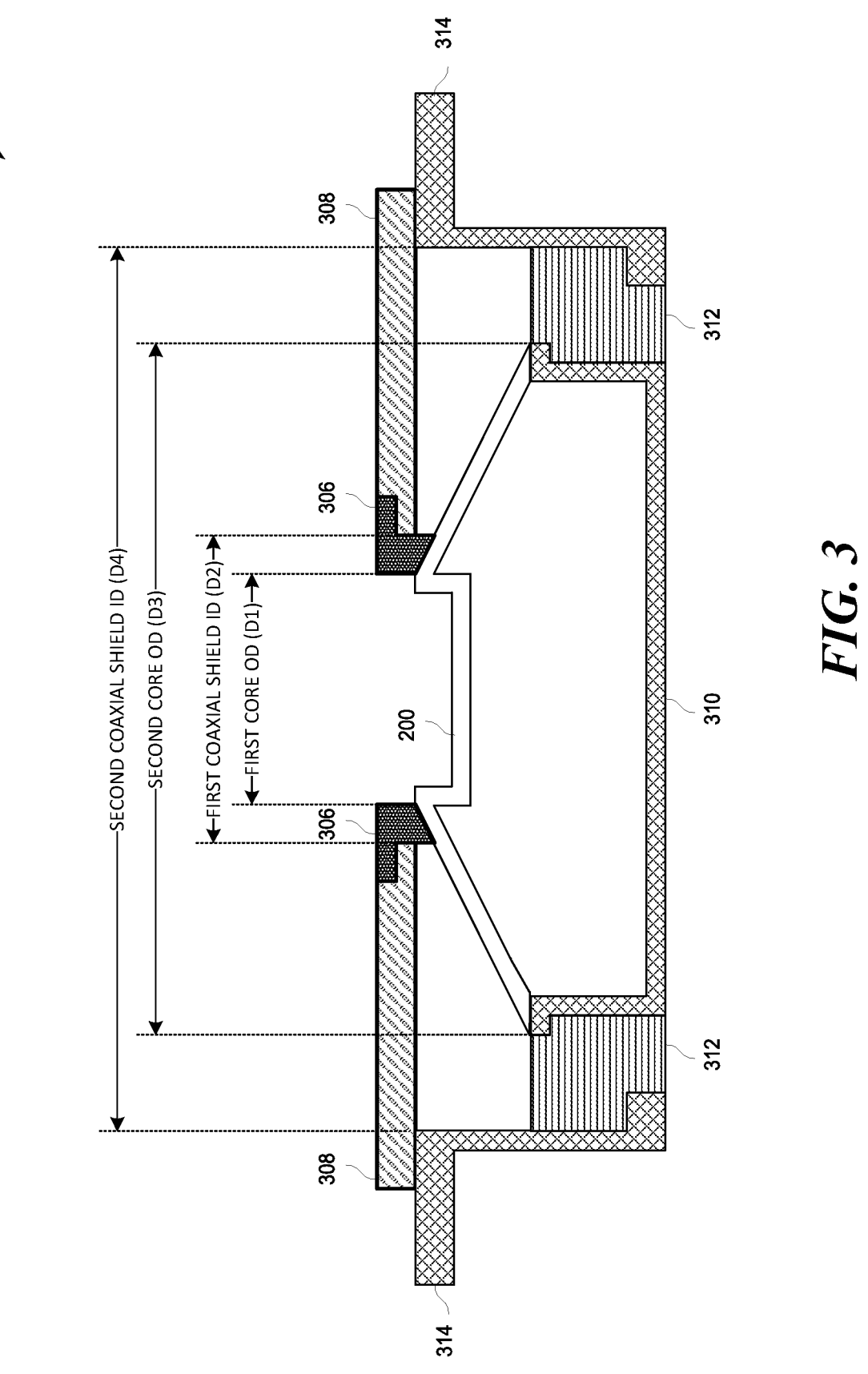
FIG. 3 is an orthogonal, cross-sectional view of an embodiment RF connection point.
Figure 4:
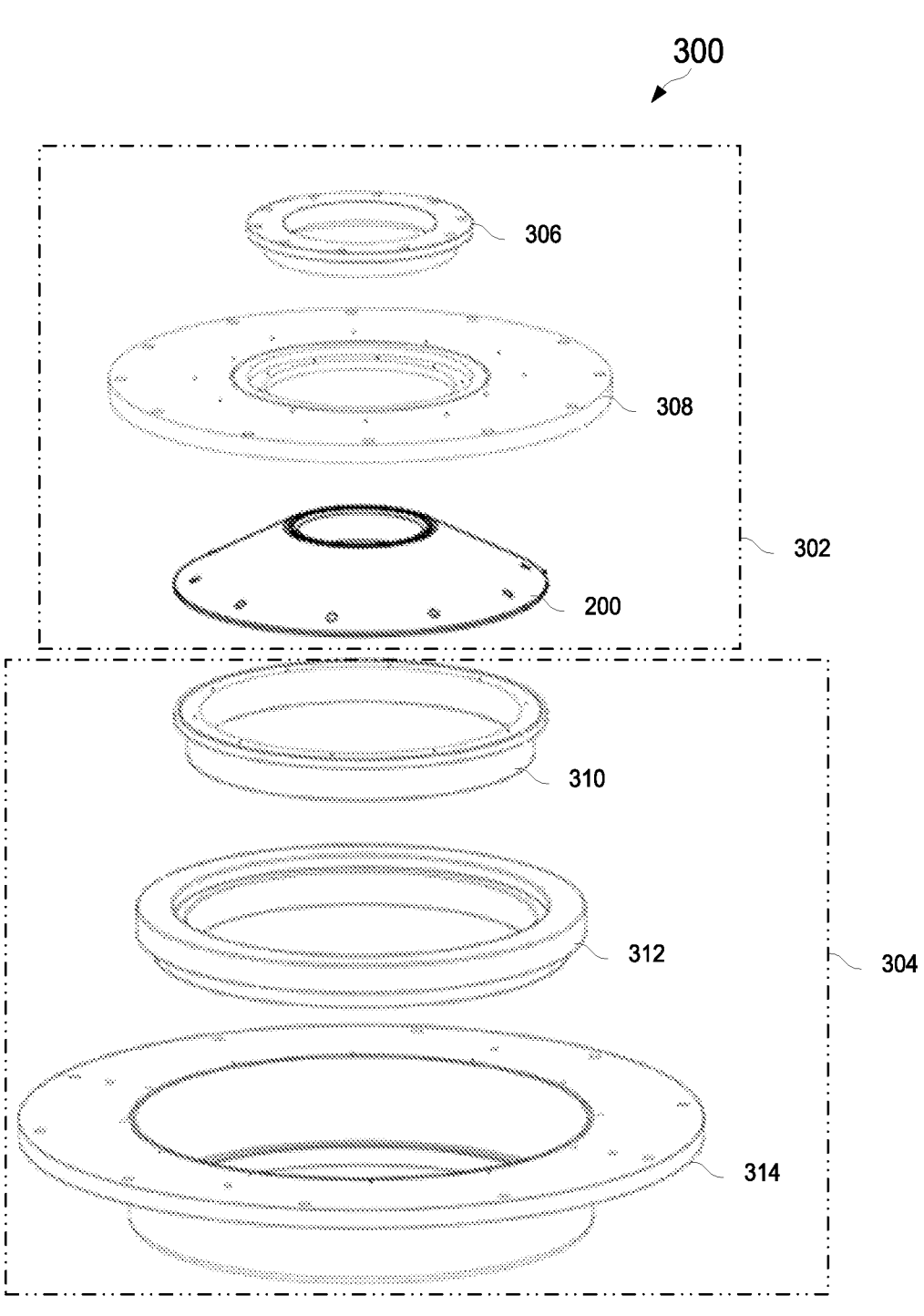
FIG. 4 is a blow-up, perspective view of an embodiment RF connection point.

FIG. 3 illustrates an orthogonal, cross-sectional view of an embodiment RF connection point 300. FIG. 4 illustrates a blow-up, perspective view of the embodiment RF connection point 300.

In embodiments, the RF connection point 300 is a transition point at the output of the matching network 103 to the resonating structure 104. It is noted that the RF connection point 300 may include additional components not shown in FIGS. 3 and 4.

A typical RF coaxial structure is formed by a center conductor (i.e., coaxial core), an outer conductor (i.e., coaxial shield), and an insulator arranged between the two conductors. The RF signal is transmitted through the center conductor in such RF coaxial structures. The outer conductor, which is typically grounded, minimizes RF leakage and prevents interference from external signals.

FIGS. 3 and 4 show that a first coaxial interface 302 includes the adapter 200, a first insulator 306, and a first coaxial shield 308. A second coaxial interface 304 includes a second core 310, a second insulator 312, and a second coaxial shield 314.

The adapter 200, the second core 310, the first coaxial shield 308, and the second coaxial shield 314 are conductive. In embodiments, adapter 200, the second core 310, the first coaxial shield 308, and the second coaxial shield 314 are made from copper. The first insulator 306 and the second insulator 312 are composed of an insulating material, such as a dielectric material. In embodiments, the coaxial insulator may be air or vacuum. In such embodiments, additional mechanical features may be included to provide structural support for the spacing between the various conductive structures.

The adapter 200 and the first coaxial shield 308 are RF coupled to the second core 310 and the second coaxial shield 314, respectively. In embodiments, the first coaxial shield 308 and the second coaxial shield 314 are coupled to RF ground.

In embodiments, the adapter 200 is coupled to the second core 310 and the volume in-between is vacuum sealed. The showerheads or diagnostic sensors are positioned within the vacuum-sealed volume in such an embodiment. The showerheads can pump gas and provide cooling within the volume through openings on the sidewalls of the conical frustum 202 of adapter 200.

During plasma processing, the temperature of the materials surrounded by the plasma increase in temperature. The change in temperature results in a change in impedance in the transmission medium through which RF travels. The placement of cooling showerheads within the interior volume of the adapter 200 minimizes impedance swings resulting from the change in temperature. The minimization of the impedance swings during an operation of the plasma chamber 106 reduces RF reflections where significant differences in the impedance of the transmission medium would have otherwise been formed.

In embodiments, the outer surface of adapter 200 and the second core 310 may be coated with a dielectric material. The coating may be in place of, or in addition to, the first insulator 306 and the second insulator 312.

In embodiments, the first coaxial interface 302 (sans adapter 200) is an RF output of the matching network 103. In embodiments, the second coaxial interface 304 is an RF input of the resonating structure 104. The RF output of the matching network includes a core (not shown) that is RF coupled to adapter 200.

Adapter 200 provides an RF transition point between the RF waves traveling from the first interface to the second interface. Advantageously, the adapter 200 operates across a wide bandwidth and provides minimal RF reflection at the transition between the two interfaces. In the first coaxial interface 302, RF waves are transmitted using adapter 200. In the second coaxial interface 304, RF waves are transmitted using the second core 310.

The top base 208 of the conical frustum of adapter 200 has an outer diameter D1. The first coaxial shield 308 has an inner diameter D2. The second core 310 has an outer diameter D3 and the second coaxial shield 314 has an inner diameter D4.

During an operation of the plasma processing system 100, the impedance of the plasma within the plasma chamber 106 varies considerably. The plasma impedance variation can be due to various factors such as the operating frequency, change in temperature and pressure within the plasma chamber 106, increase or decrease of gas flow rates, and the like. As such, even though the forward and reflected power can be measured and adjusted at the matching network 103, the ability to monitor the reflections after the matching network 103 at the load of the RF chain is limited.

The adapter 200 provides a broadband matching network with minimal reflection across a range of frequencies and load conditions of the plasma processing system 100. Thus, even though the plasma processing system is running at different frequencies and under different load conditions depending on the particular operation and process, the adapter 200 does not need to be changed, and a single chamber can be used across many applications.

The dimensions and material of adapter 200 can be parameterized based on the load conditions, operating frequency range of adapter 200, and dimensions of the particular components coupled with adapter 200. Specifically, the dimensions of the outer diameter D1 of adapter 200, the inner diameter D2 of the first coaxial shield 308, the outer diameter D3 of the second core 310, the inner diameter D4 of the second coaxial shield 314, the cone angle (a), the outer diameter D1, the height of the cylinder 204, the conductive material of the adapter 200, the surface treatment (e.g., flat, wavy, step-type, etc.), the dielectric material of the first insulator 306 and the second insulator 312, the optional surface coating of the adapter 200 all have an impact on the operating range of the adapter 200.

Some parameters (e.g., dimensions and material of the second core 310) may dictate and place constraints on other parameters. However, in general, the various dimensions and material of adapter 200 may be optimized based on the frequency range and load conditions under which the plasma processing system operates.

In embodiments, the operational frequency range for the adapter 200 depends on the ratio of (i) the distance between the outer diameter D1 of the adapter 200 and the inner diameter D2 of the first coaxial shield 308 (i.e., D2-D1) and (ii) the distance between the outer diameter D3 of the second core 310 and the inner diameter D4 of the second coaxial shield 314 (i.e., D4-D3).

In a first example, embodiments of this disclosure can operate at a frequency between 13 megahertz (MHz) and 220 MHz. In a second example, embodiments of this disclosure can operate at a frequency between 30 MHz and 300 MHz, corresponding to a very high frequency (VHF) range. In both examples, a single adapter 200 can operate across the frequency range and under multiple load conditions (e.g., plasma impedance changes through plasma processing applications). It is noted that these frequency ranges are non-limiting and other ranges are similarly contemplated.

For example, an adapter 200 used in RF communication networks may operate in the gigahertz (GHz) or kilohertz (kHz) range.

The operating frequency ranges from 13 to 250 MHz in an embodiment used to process a 200 mm wafer. In such an embodiment, the outer diameter D1 of adapter 200 is approximately 100 mm, the inner diameter D2 of the first coaxial shield 308 is approximately 125 mm, the outer diameter D3 of the second core 310 is approximately 244 mm, the inner diameter D4 of the second coaxial shield 314 is approximately 296 mm, the cone angle (a) is approximately 28.090, the outer diameter D1 is approximately 243.6 mm, the height of the cylinder 204 is approximately 25 mm, the conductive material of the adapter 200 is aluminum, the surface treatment is electropolishing, the dielectric material of the first insulator 306 and the second insulator 312 is Polytetrafluoroethylene (PTFE)/Teflon™ and quartz respectively, the optional surface coating of the adapter 200 is type III hard coat anodize.

The operating frequency ranges from 13 to 250 MHz in an embodiment used to process a 300 mm wafer. In such an embodiment, the outer diameter D1 of adapter 200 is approximately 150 mm, the inner diameter D2 of the first coaxial shield 308 is approximately 188 mm, the outer diameter D3 of the second core 310 is approximately 366 mm, the inner diameter D4 of the second coaxial shield 314 is approximately 444 mm, the cone angle (a) is approximately 28.09°, the outer diameter D1 is approximately 365.4 mm, the height of the cylinder 204 is approximately 38 mm, the conductive material of the adapter 200 is aluminum, the surface treatment is electropolishing, the dielectric material of the first insulator 306 and the second insulator 312 is Polytetrafluoroethylene (PTFE)/Teflon™ and quartz respectively, the optional surface coating of the adapter 200 is silver coating.

It should be appreciated that these dimensions and material call-outs are both approximations (+/−5% tolerance) and non-limiting examples. Similar dimensions and material selections suitable for specific applications of the adapter 200 are contemplated based on the frequency, application, or the like.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. An apparatus for a plasma processing system, the apparatus comprising:

a conductive conical frustum having an open top base, an open bottom base, and a surface area coupling the open top base to the open bottom base, defining a first interior volume; and a conductive cylinder positioned within the conductive conical frustum and having a closed bottom base and an open top base, defining a second interior volume, at least a portion of the second interior volume arranged within the first interior volume, the open top base of the conductive cylinder being connected to sidewalls of the open top base of the conductive conical frustum, the conductive cylinder having a height shorter than a height of the conductive conical frustum, wherein the apparatus is configured to provide a broadband RF transition from a matching network to a resonating structure of the plasma processing system for frequencies ranging between 13 megahertz (MHz) and 220 MHz.

2. The apparatus of claim 1, wherein the resonating structure of the plasma processing system is connected to sidewalls of the open bottom base of the conductive conical frustum.

3. The apparatus of claim 1, wherein the apparatus and the resonating structure form a volume that is vacuum sealed.

4. The apparatus of claim 1, wherein a sensor, a cooling element, or a combination thereof is attached to an interior portion of the surface area of the conductive conical frustum.

5. The apparatus of claim 1, wherein the surface area of the conductive conical frustum is one of a wavy, a step layer, or a flat type of surface.

6. The apparatus of claim 1, wherein the apparatus is coated with a dielectric material.

7. The apparatus of claim 1, wherein the apparatus is arranged between the matching network and the resonating structure, an RF wave propagating from an RF source coupled to the matching network and resonating by the resonating structure during a plasma processing of a semiconductor wafer in the plasma processing system.

8. A plasma processing system, comprising:

a matching network;

a resonating structure; and an apparatus coupling the matching network to the resonating structure, the apparatus configured to provide a broadband RF transition from the matching network to the resonating structure of the plasma processing system for frequencies ranging between 13 megahertz (MHz) and 220 MHz, the apparatus comprising:

a conductive conical frustum having an open top base, an open bottom base, and a surface area coupling the open top base to the open bottom base, and a conductive cylinder positioned within the conductive conical frustum and having a closed bottom base and an open top base, the open top base of the conductive cylinder being connected to sidewalls of the open top base of the conductive conical frustum, the conductive cylinder having a height shorter than a height of the conductive conical frustum, the conductive cylinder having an interior volume coaxially nested within an interior volume of the conductive conical frustum.

9. The plasma processing system of claim 8, wherein the apparatus and the resonating structure form a volume that is vacuum sealed.

10. The plasma processing system of claim 8, wherein a sensor, a cooling element, or a combination thereof is attached to an interior portion of the surface area of the conductive conical frustum.

11

12

11. The plasma processing system of claim 8, wherein the surface area of the conductive conical frustum is one of a wavy, a step layer, or a flat type of surface.

12. The plasma processing system of claim 8, wherein the apparatus is coated with a dielectric material.

13. The plasma processing system of claim 8, wherein the apparatus is arranged between the matching network and the resonating structure, an RF wave propagating from an RF source coupled to the matching network and resonating by the resonating structure during a plasma processing of a semiconductor wafer in the plasma processing system.

14. An apparatus for a plasma processing system, the apparatus comprising:

a conductive conical frustum having an open top base, an open bottom base, and a surface area coupling the open top base to the open bottom base, wherein a diameter of the top base is smaller than a diameter of the bottom base; and a conductive cylinder positioned within the conductive conical frustum and having a closed bottom base and an open top base, the open top base of the conductive cylinder being connected to sidewalls of the open top base of the conductive conical frustum, the conductive cylinder having a height shorter than a height of the conductive conical frustum, an interior volume of the conductive cylinder radially surrounded by an interior volume of the conductive conical frustum, wherein the conductive conical frustum and the conductive cylinder are configured to provide an impedance transition that minimizes RF reflections across multiple load conditions of the plasma processing system.

15. The apparatus of claim 14, wherein an angle between the top base of the conical frustum and the surface area of the conical frustum is between 1° and 89°.

16. The apparatus of claim 14, wherein the surface area of the conductive conical frustum is one of a wavy, a step layer, or a flat type of surface.

17. The apparatus of claim 14, wherein the apparatus is coated with a dielectric material.

18. The apparatus of claim 14, wherein a sensor, a cooling element, or a combination thereof is attached to an interior portion of the surface area of the conductive conical frustum.

19. The apparatus of claim 14, wherein the apparatus and the resonating structure form a volume that is vacuum sealed.

20. The apparatus of claim 14, wherein the conductive conical frustum and the conductive cylinder are made from aluminum or copper.

\* \* \* \* \*